March 12, 1968 A. N. WRIGHT ET AL 3,372,672
PHOTOPOLYMERIZATION MEANS IN A VAPOR DEPOSITION COATING APPARATUS
Filed March 21, 1966 2 Sheets-Sheet 1

Inventors:
Archibald N. Wright;
Wilfred F. Mathewson, Jr.,
by Paul R. Webb, II
Their Attorney.

March 12, 1968 A. N. WRIGHT ET AL 3,372,672

PHOTOPOLYMERIZATION MEANS IN A VAPOR DEPOSITION COATING APPARATUS

Filed March 21, 1966 2 Sheets-Sheet 2

Inventors:
Archibald N. Wright;
Wilfred F. Mathewson, Jr.,
by Paul R. Webb, II
Their Attorney.

United States Patent Office 3,372,672
Patented Mar. 12, 1968

3,372,672
PHOTOPOLYMERIZATION MEANS IN A VAPOR DEPOSITION COATING APPARATUS

Archibald Nelson Wright, Schenectady, N.Y., and Wilfred F. Mathewson, Jr., Franklin, Mich., assignors to General Electric Company, a corporation of New York
Filed Mar. 21, 1966, Ser. No. 536,125
2 Claims. (Cl. 118—49.5)

This invention relates to film deposition apparatus, and more particularly to apparatus for forming films, coatings, and products including such films, and coating by ultraviolet surface photopolymerization of a photopolymerizable gaseous material.

Films and coatings, which are formed by ultraviolet surface photopolymerization of a photopolymerizable gaseous material, are useful for a wide variety of applications, including covering layers for various metallic and non-metallic substrates, adhesive films on diamonds and cubic boron nitride, capacitor dielectrics, cryogenic device insulation, insulation for microelectric devices, as a primer or as insulation on electrically conductive wire, and for corrosion protection.

Photopolymerizable materials which can be employed in our improved apparatus include, for example, ethylene, 1,3-butadiene, 2,4-hexadiene, 1,5-hexadiene, methyl methacrylate, hexachlorobutadiene, tetrafluoroethylene, trifluoromonochloroethylene, monofluorotrichloroethylene, hexafluorobutadiene, and acrylonitrile.

It is an object of our invention to provide an improved apparatus for forming a film by ultraviolet surface photopolymerization of a photopolymerizable gaseous material.

It is another object of our invention to provide an improved apparatus for forming such a film in a predetermined configurational pattern.

It is a further object of our invention to provide an improved apparatus for forming a film by ultraviolet surface photopolymerization of a photopolymerizable gaseous material in which the substrate support member is cooled during photopolymerization to increase the rate of film formation.

It is a still further object of our invention to provide an improved apparatus for forming a film by ultraviolet surface photopolymerization of a photopolymerizable gaseous material in which the substrate support member is vibrated during photopolymerization to increase the surface area of film formation.

In accordance with our invention, a film deposition apparatus comprises an enclosure, means to evacuate the enclosure, means to supply a gaseous photopolymerizable material to the enclosure, a substrate support member positioned within the enclosure, and an ultraviolet light source having an effective wave length of 2,000 to 3,500 angstroms in operative relationship to the support member.

These and various other objects, features and advantages of the invention will be better understood from the following description taken in connection with the accompanying drawing in which.

Figures 1, 2:
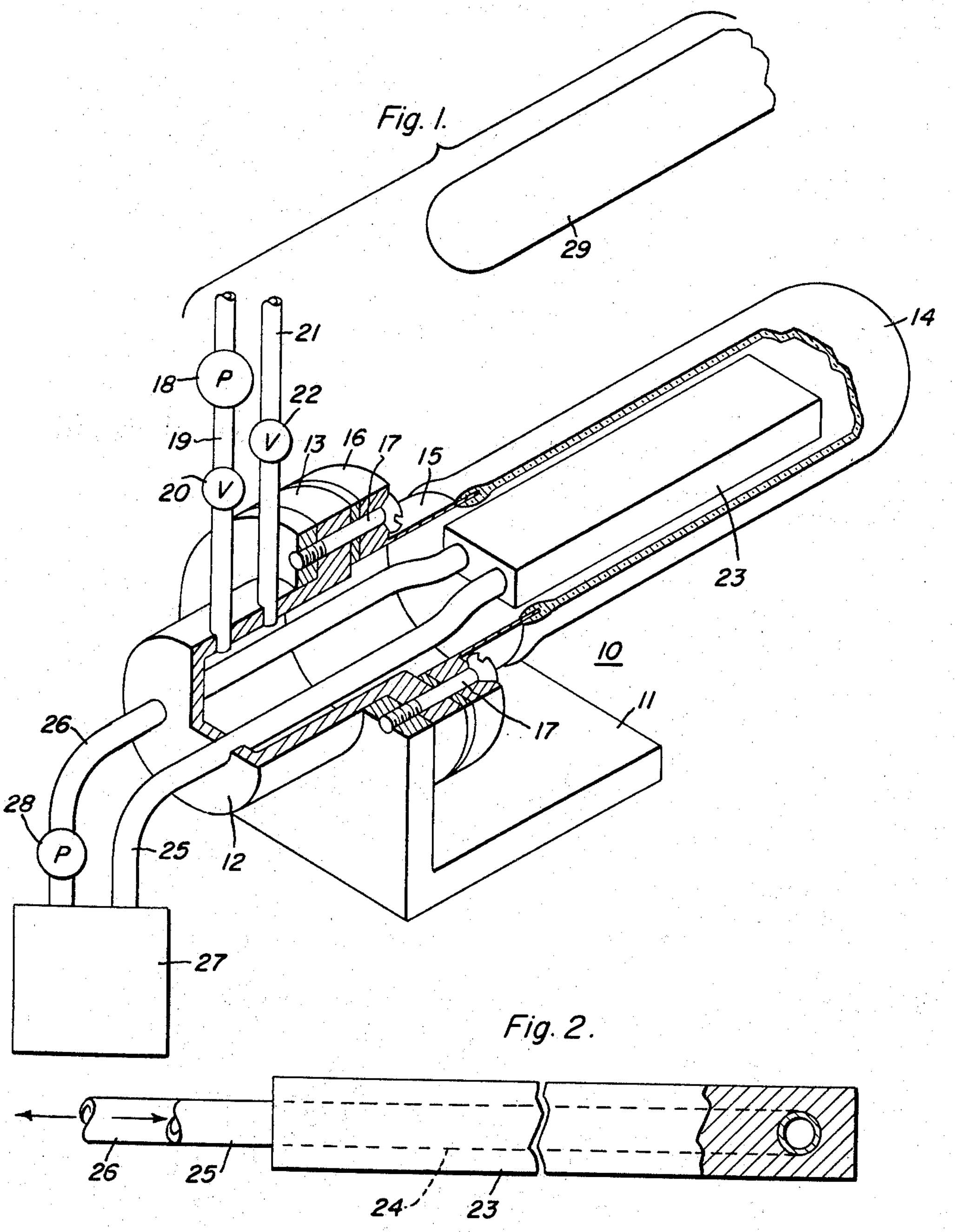
FIGURE 1 is a perspective view partially in section of an apparatus for forming films, coatings and products in accordance with our invention.
FIGURE 2 is an enlarged side elevational view of a portion of the apparatus shown in FIGURE 1.

In FIGURE 1 of the drawing, an apparatus is shown generally at 10 for forming films, coatings and products having such films or coatings thereon in accordance with our invention. A base or support surface (not shown) is provided on which is mounted an L-shaped bracket 11 to support an enclosure or chamber 12 having a flange 13 at its open end. A quartz tube 14 is bonded adjacent to its oopen end by a suitable metal-ceramic seal to a metal cylinder 15 having a flange 16 at its opposite end. Flange 16 is readily threaded to and unthreaded from flange 13 of enclosure 12 by means of a plurality of threaded fasteners 17. A vacuum pump 18 is connected by a line 19 to enclosure 12 to evacuate enclosure 12 and associated quartz tube 14. A control valve 20 is provided in evacuation line 19. An inlet line 21 is connected at one end to enclosure 12 and at its other end to a source (not shown) of material to be supplied in gaseous state to tube 14. A control valve 22 is provided in line 21 to control the supply of material to enclosure 12 and tube 14.

A support block 23 of a material such as copper is shown positioned within tube 14. Block 23 has a U-shaped metal tube 24 imbedded therein, the two connecting tube portions 25 and 26 of which extend through cylinder 15, flanges 16 and 13, enclosure 12 and through the wall of enclosure 12. Tube 24 circulates a cooling medium such as ethanol to block 23 and positions the block. Tube portions 25 and 26 of tube 24 are connected to a cooling unit 27 which is positioned outside of enclosure 12. Unit 27 consists of, for example, a Dewar flask, in which is positioned a coil connected to ends 25 and 26 of tube 24, and which is filled with ice. A thermometer (not shown) is positioned in the ice to record the temperature within unit 27. Other cooling units, such as a heat exchanger or a refrigeration device, can also be employed. A circulating pump 28 is connected to tube portion 26 to circulate the coolant through tube 24. An ultraviolet light 29, which is normally provided with a reflector (not shown), is shown outside and spaced above quartz tube 14 and supported in any suitable manner. Such a light source provides ultraviolet light in a region of about 2,000 to 3,500 angstroms, which is directed by the reflector (not shown) toward the upper surface of block 23. For example, an Hanovia 700 watt lamp with a reflector will provide this particular light region. Light source 29 can also be positioned within an enclosure in operative relationship to the substrate support member. Additionally, light source 29 can be positioned outside an ultraviolet light transmitting window in such an enclosure which window is in alignment with the substrate support member. A metal hood with a door, which is not shown, is positioned around the above apparatus during its operation because of the employment of the ultraviolet light. Such enclosure is provided with an exhaust opening and associated fan to prevent a concentration of ozone by employment of the lamp.

In FIGURE 2 of the drawing, an enlarged side elevational view is shown of support block 23 which was described above in connection with FIGURE 1 of the drawing. Block 23 has a U-shaped tube 24 imbedded therein, the two connecting tube portions 25 and 26 of which circulate a cooling medium to and from block 23, respectively.

Figure 3:
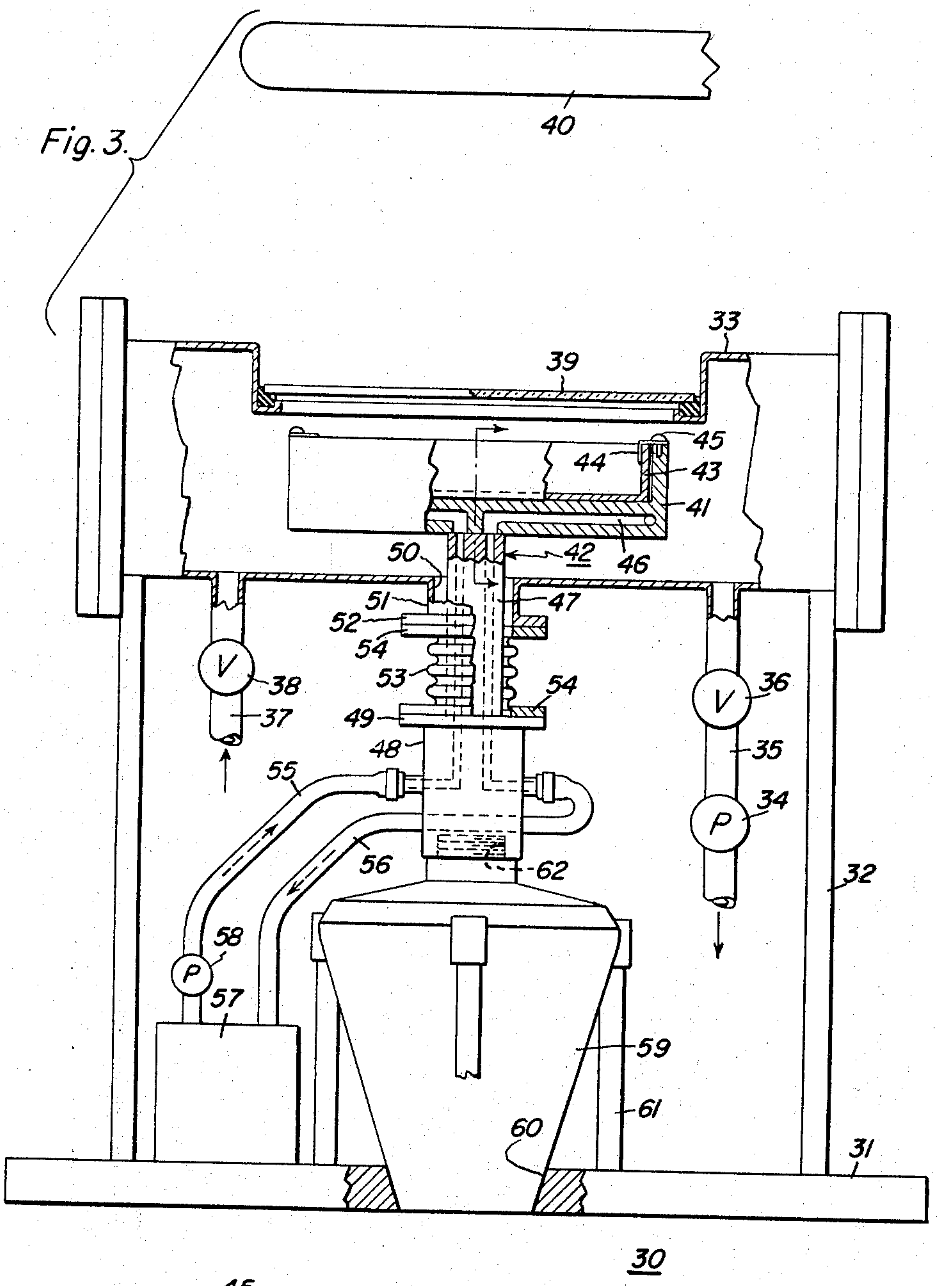
FIGURE 3 is a side elevational view partially in section of a modified apparatus for forming films, coatings and products in accordance with our invention.

In FIGURE 3 of the drawing, a modified apparatus is shown generally at 30 for forming films, coatings and products having such films or coatings thereon in accordance with our invention. A base 31 is provided on which is mounted a pair of support members 32. An enclosure 33 is positioned upon support members 32. A vacuum pump 34 is connected by a line 35 to enclosure 33 to evacuate the latter. A control valve 36 is provided in evacuation line 35. An inlet line 37 is connected at one end to enclosure 33 and at its other end to a source (not shown) of material to be supplied in gaseous form to enclosure 33. A control valve 38 is provided in line 37 to control the supply of material to enclosure 33. An ultraviolet light transmitting window 39 is shown positioned in the upper wall portion of enclosure 33 and is removable therefrom.

An ultraviolet light 40, which is normally provided with a reflector (not shown) is shown outside and spaced above enclosure 33 in alignment with window 39. Light 40 is supported in any suitable manner. Such a light source provides ultraviolet light in the region of about 2,000 to 3,500 angstroms, which is directed by the reflector (not shown) through window 39 into enclosure 33. A metal hood (not shown), as described above for FIGURE 1, is also positioned around the enclosure and light source. A substrate support member 41 is positioned within enclosure 33 and connected to the driven end of a driver shaft 42. A tray or container 43 is located within the upper recessed portion of member 41 to provide a container for material to be used during the operation of apparatus 30. Brackets 44 are shown at opposite ends of tray 43 which brackets are fastened by means of screws 45 to support member 41. A cooling tube 46 is imbedded in substrate support member 41 to provide cooling for the member, associated tray 43 and material placed in tray 43.

Driver shaft 42 has an upper driven portion 47 and a lower driven portion 48. Driver portion 47 of shaft 42 has a smaller diameter than driver portion 48. Shaft 42 is shown with a flange 49 at the junction of portions 47 and 48. Driven portion 47 of shaft 42 extends through an aperture 50 in the wall of enclosure 33. A closure 51 with an associated flange 52 extends outwardly from and surrounds aperture 50. A diaphragm 53 with a flange 54 at each end is connected by means of these flanges to associated flange 52 of closure 51 and to flange 49 on driver shaft 42. In this manner, a vacuum can be maintained in enclosure 33 while shaft 42 can be vibrated. Tube 46 within substrate support member 41 continues through the interior of shaft 42 and is connected to an inlet tube 55 and an outlet tube 56. Tubes 55 and 56 are connected to a cooling unit 57 which is shown positioned outside enclosure 33 and supported on base 31. Unit 57 consists of, for example, a Dewar flask in which is positioned a coil connected to the ends of tubes 55 and 56, and which is filled with ice. A thermometer (not shown) is positioned in the ice to record the temperature within unit 57. Other cooling units, such as a heat exchanger or a refrigeration device, can also be employed. A circulating pump 58 is connected to inlet tube 55 to circulate a coolant through tube 55, tube 46 and outlet tube 56. A wide variety of coolants might be employed, for example, water or ethanol.

A vibratory device 59 is shown positioned in a recess 60 in base 31. A plurality of support members 61 are attached to base 31 and to device 59 to position the device. The upper end of device 59 fits into a recess 62 in the end of a driver portion 48 of shaft 42. For example, a multi-impedance driver unit might be employed for device 59.

Figure 4:
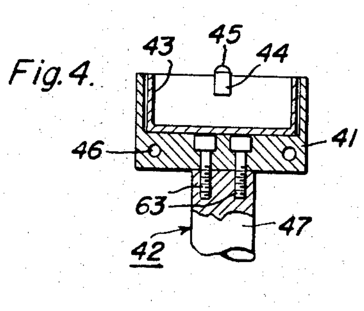
FIGURE 4 is a sectional view of a portion of the apparatus taken on line 3—3 of FIGURE 3.

In FIGURE 4 of the drawing, there is shown a sectional view of a portion of apparatus 30 taken on line 3—3 of FIGURE 3. In FIGURE 4 the end of driven portion 47 of shaft 42 is shown connected to substrate support member 41 by means of a pair of threaded fasteners 63. In this manner the driven end 47 of shaft 42 is connected to substrate support member 41 and positions this member within enclosure 33.

We found unexpectedly that an apparatus can be constructed for forming films and coating by ultraviolet surface photopolymerization of a photopolymerizable gaseous material. Such an apparatus comprises an enclosure, means to evacuate the enclosure, means to supply a photopolymerizable gaseous material to the enclosure, a substrate support member positioned within the enclosure, and an ultraviolet light source having an effective wave length of 2,000 to 3,500 angstroms positioned within the enclosure in operative relationship to the support member. We found further that substrate support member cooling means increased the rate of film formation in the apparatus. When means were provided to vibrate the support member during apparatus operation, a larger surface of the material in particle form was coated. When we used the above type of light source outside the enclosure, we provided an ultraviolet light transmitting window in the wall of the enclosure whereby the light source was aligned with the substrate support member.

In an illustrative operation of the apparatus shown in FIGURE 1 of the drawing, a substrate support in the form of a 1 x 3 inch glass microscope slide with a 0.25 micron thick aluminum film substrate thereon was positioned on copper support block 23. A stainless steel light mask of dimensions 1 x 3 inch with three slots therein was placed on the upper surface of the aluminum film substrate 28 thereby covering the film substrate except for the slots. Quartz tube 14 was then attached by its flange 16 to flange 13 to enclosure 12 by means of threaded fasteners 17. Vacuum pump 18 was started and pumped down the chamber defined by tube 14, cylinder 15, and enclosure 12 to a pressure of about two microns of mercury. Valve 20 was then closed. A material selected from the above-mentioned group was supplied from a liquid or solid source (not shown) through line 21 in a gaseous state to enclosure 12 whereby it was fed into the interior of quartz tube 14. Each of the above materials is initially retained in its liquid or solid state by maintaining its temperature below room temperature which is accomplished by employing a cooling bath surrounding the liquid materials. The monomer is also maintained at a vapor pressure in the range of 0.1 to 8 millimeters of mercury by the temperature of the cooling bath whereby its introduction from the source to the inlet line is in a gaseous state. Ultraviolet lamp 29 was positioned above quartz tube 14 and spaced approximately two inches from the upper surface of the aluminum film. The lamp has an effective wave length in the range of 2,000 to 3,500 angstroms.

The monomer was introduced into quartz tube 14 and the pressure rose. A metal hood (not shown) as described above is positioned around apparatus 10 since an ultraviolet light source is used. Lamp 29 is turned on. After a period of time, lamp 29 was shut off, monomer valve 22 was closed, and the system was pumped down to about two microns pressure to remove all by-products. Tube 14 was cooled to room temperature and disconnected by unthreading fasteners 17 which held its associated flange 16 to flange 13. After tube 14 was removed, the metal light mask was removed and the substrate support was picked up and examined. A continuous film had been formed on the aluminum film substrate which was pinhole-free.

In an illustrative operation of the apparatus shown in FIGURE 3 of the drawing, tray 43 is filled with a monolayer of diamond particles, which tray had been affixed previously to substrate support block 41. Window 39 is then positioned in the upper wall of enclosure 33. Vacuum pump 44 is started and pumped down the chamber defined by enclosure 33 to a pressure of about one micron. Valve 36 is then closed. A material, which is photopolymerizable in its gaseous state, is supplied from a liquid source (not shown) through line 37 in its gaseous state to enclosure 33. The above material is initially retained in its liquid state by maintaining its temperature below room temperature which is accomplished by employing a cooling bath surrounding the liquid material. The material is also maintained at a vapor pressure in the range of 0.1 to 8 millimeters of mercury by the temperature of the cooling bath whereby its introduction from the source to the inlet line is in a gaseous state. Ultraviolet lamp 40 is positioned outside and in alignment with window 39 and substrate support member 41. The lamp has an effective wave length in the range of 2,000 to 3,500 angstroms.

The monomer is introduced into enclosure 33 and the pressure rises. Pump 58 is turned on and a coolant, such as ethanol, is circulated through inlet tube 55, tube 46, and outlet tube 56, thereby cooling substrate support member 41, tray 43, and the diamond particles positioned within tray 43.

Vibratory device 59 is turned on, whereupon shaft 42 is vibrated. Substrate support member 41, which is connected to the driven end of shaft 42, is vibrated by shaft 42 which vibration causes the diamond particles in tray 43 to move in a random fashion. In this manner, a larger surface area of the particles is exposed to both the monomer and the light source during the operation of the apparatus.

A metal hood (not shown) is positioned around apparatus 30 since an ultraviolet light source is used. Lamp 40 is turned on. After a period of time, lamp 40 is shut off, monomer valve 38 is closed and the system is pumped down to about 10 microns pressure to remove all by-products. The metal hood is removed and the vacuum is broken. Enclosure 33 is cooled to room temperature and, subsequently, window 39 is removed. Tray 43 is removed from substrate support member 41 and the diamond particles in the tray are examined. The particles have a green-gray color as opposed to the gray color of the initial, uncoated diamonds. Upon further examination under a microscope these diamond particles show an adherent, continuous, pinhole-free film formed on at least a portion of the faces of the diamond particles.

Examples of films, coatings and products including such films and coatings which are made in the apparatus embodying our invention are as follows:

*Example 1*

Apparatus was set up in accordance with FIGURE 1 of the drawing. A substrate support, a microscope glass slide 1 x 3 inches, which was provided with a 0.25 micron thick aluminum film substrate thereon, was positioned on the copper support block. A stainless steel light mask 1 x 3 inches and having three slots therein was placed on the surface of the aluminum substrate. The quartz tube was positioned around the support block by threading its flange to the flange of the enclosure to which the gaseous material supply line and vacuum pump were connected. An ultraviolet light source, in the form of a Hanovia 700 watt lamp with a reflector was positioned above the quartz tube and spaced about two inches from the upper surface of the aluminum film substrate. The system was pumped down to a pressure of two microns and the control valve was closed. Hexachlorobutadiene of 100% purity was introduced in the gaseous state into the quartz tube. This monomer was maintained at its source (not shown) in liquid form by positioning in a cooling bath which was held at a temperature of 18° C. thereby providing a vapor pressure of 0.14 millimeter of mercury. Upon opening of the control valve in the supply line, the gaseous hexachlorobutadiene was supplied to the quartz tube. A metal hood was positioned around the apparatus. The lamp, which had an effective wave length in the range from 2,000 to 3,500 angstroms, was turned on. Hexachlorobutadiene in the gaseous state was supplied to the quartz tube under the above light for a period of 60 minutes. In this operation, a film was formed on the aluminum film substrate by ultraviolet surface photopolymerization of gaseous hexachlorobutadiene.

While it is not shown in the drawing, a plurality of thermocouples was provided to measure the temperature of the substrate and of the surface of the evaporated aluminum film to provide temperature information. Cooling means for the substrate support member, which are shown in FIGURE 1 of the drawing and described above, was employed in this example whereby an average temperature of 115° C. was obtained from substrate and aluminum film measurements. The process was concluded by discontinuing the supply of gaseous hexachlorobutadiene, turning off the ultraviolet light source, removing the hood opening the vacuum pump control valve, and pumping down the interior of enclosure 12 and tube 14 to a pressure of about 10 microns to remove gaseous material and any by-products therefrom. The vacuum was then broken and the quartz tube was removed by unthreading its flange from the enclosure flange. The light mask was removed and the aluminum film on the glass substrate was examined. Visual examination disclosed three separate thin films, each of which was continuous. The film was measured by capacitance and interferrometric techniques and found to have an average thickness of 1990 angstroms. Thus, the growth rate was 33.2 angstroms per minute.

Thus, a product was obtained from this example which comprised a glass base with an aluminum film substrate thereon, on which a continuous, pinhole-free thin film adhered to the upper surface of the substrate.

*Examples 2–5*

In the following examples, the same apparatus, substrate, material and procedures were followed as in Example 1. Table 1 sets forth below the example number, the purity of the hexachlorobutadiene which was employed, the time of film formation in minutes, the average substrate temperature in degrees centigrade, the average film thickness in angstroms, the growth rate of the film in angstroms per minute, and the breakdown strength of the film in volts direct current.

TABLE 1

| Example No. | Monomer Purity, Percent | Time (Min.) | Average Substrate Temp., ° C. | Average Film Thickness, A. | Growth Rate, A./minute | Breakdown Strength, Volts DC |
|---|---|---|---|---|---|---|
| 2 | 99.7 | 285 | 177 | 508 | 1.78 | 9.0 at 525 A. |
| 3 | 100 | 275 | 177 | 645 | 2.35 | 8.5 at 455 A. |
| 4 | 100 | 30 | 115 | 1,110 | 36.7 | |
| 5 | 99.7 | 15 | 102 | 2,040 | 136.0 | 24 at 2,050 A. |

*Example 6*

Apparatus is set up in accordance with FIGURE 3 of the drawing. Three grams of 80/100 mesh diamond particles are spread on an aluminum tray which is about six inches long and one inch wide. The tray is placed in the upper recessed portion of the substrate support member. The window is then positioned in the upper wall of the enclosure. An ultraviolet light source, in the form of a Hanovia 700 watt lamp with a reflector, is positioned outside the enclosure and in alignment with the window and the substrate support member. The system is pumped down to a pressure of one micron of mercury and the control valve is closed. Hexachlorobutadiene is introduced in the gaseous state into the enclosure. This monomer is maintained at its source (not shown) in liquid form by positioning in a cooling bath which was held at a temperature of 18° C. thereby providing a vapor pressure of 0.13 millimeter of mercury. Upon opening of the control valve in the supply line, the gaseous hexachlorobutadiene is supplied to the enclosure. A metal hood is positioned around the apparatus.

The circulating pump is started and flows ethanol through the substrate support member. The vibratory device is activated thereby vibrating the diamond particles in the tray. The lamp, which has an effective wave length in the range from 2,000 to 3,500 angstroms, is turned on. The cooling unit reduces the temperature of the substrate support member, tray and diamond particles from a temperature of 177° C., caused by the heat from the light source, to a substrate temperature of about 102° C. resulting in a substantial rate increase in the film formation and a shortening of the time involved. After 36 minutes, the process is concluded by discontinuing the supply of gaseous hexachlorobutadiene, turning off the ultraviolet light source and vibratory device, stopping the circulating pump, removing the hood, opening the vacuum pump control valve, and pumping down the interior of the enclosure to a pressure of about one micron of mercury to remove gaseous material and any by-products therefrom. The vacuum is then broken and the window is removed from the enclosure. The tray with diamond particles is lifted up from the substrate support member. Visual examination disclosed an adherent film on at least a portion of the faces of the diamond particles.

While other modifications of the invention and variations thereof which may be employed within the scope of the invention have not been described, the invention is intended to include such as may be embraced within the following claims:

What we claim as new and desire to secure by Letters Patent of the United States is:

1. Apparatus comprising an enclosure, a vacuum pump connected to said enclosure to evacuate said enclosure, an inlet line connected to said enclosure for supplying a photopolymerizable gaseous material to said enclosure, a control valve for said inlet line, a driver shaft comprising a driver portion and a driven portion, said driven portion with a narrower diameter than the driver portion, the end of the driven portion of said driver shaft located within said enclosure, a substrate support member within said enclosure connected to the driven end of said driver shaft, an ultraviolet light source having an effective wave length of 2,000 to 3,500 angstroms positioned within said enclosure in operative relationship to said substrate support member, the driven portion of said driver shaft extending outwardly from said enclosure through an aperture in the wall of said enclosure, a closure with a flange positioned around the shaft aperture in said enclosure, a vibratory device connected to the driver end of said driver shaft, a flange on said driver shaft at the junction of the driver portion and the driven portion, a diaphragm with a flange at each opposite end thereof, one of said diaphragm flanges connected to said driver shaft flange, the other of said flanges connected to said closure flange, a cooling tube imbedded in said substrate support member and extending through said driver shaft to a point outside said enclosure, a cooling unit positioned outside said enclosure and connected to said cooling tube, and a circulating pump connected to said cooling unit for circulating a coolant through said cooling tube.

2. Apparatus comprising an enclosure, a vacuum pump connected to said enclosure to evacuate said enclosure, an inlet line connected to said enclosure for supplying a photopolymerizable gaseous material to said enclosure, a control valve for said inlet line, a driver shaft comprising a driver portion and a driven portion, said driven portion with a narrower diameter than the driver portion, the end of the driven portion of said driver shaft located within said enclosure, a substrate support member within said enclosure connected to the driven end of said driver shaft, an ultraviolet light transmitting window positioned in the wall of said enclosure, said window in alignment with said substrate support member, an ultraviolet light source having an effective wave length of 2,000 to 3,500 angstroms positioned outside said enclosure and in alignment with said window and said substrate support member, a metal hood with an exhaust positioned around at said enclosure and said light source, the driven portion of said driver shaft extending outwardly from said enclosure through an aperture in the wall of said enclosure, a closure with a flange positioned around the shaft aperture in said enclosure, a vibratory device connected to the driver end of said driver shaft, a flange on said driver shaft at the junction of the driver portion and the driven portion, a diaphragm with a flange at each opposite end thereof, one of said diaphragm flanges connected to said driver shaft flange, the other of said flanges connected to said closure flange, a cooling tube imbedded in said substrate support member and extending through said driver shaft to a point outside said enclosure, a cooling unit positioned outside said enclosure and connected to said cooling tube, and a circulating pump connected to said cooling unit for circulating a coolant through said cooling tube.

References Cited

UNITED STATES PATENTS

| | | | |
|---|---|---|---|
| 2,276,951 | 3/1942 | Fisher | 117—93.31 X |
| 2,413,973 | 1/1947 | Howk et al. | 117—93.31 X |
| 2,710,270 | 6/1955 | Cox | 117—107.1 X |
| 2,873,241 | 2/1959 | Strzyzewski et al. | |
| 2,896,570 | 7/1959 | Nack et al. | 118—48 |
| 3,036,930 | 5/1962 | Grimminger et al. | 117—93.31 |
| 3,158,499 | 11/1964 | Jenkin | 118—49 X |
| 3,213,827 | 10/1965 | Jenkin | 118—49.5 |
| 3,295,492 | 1/1967 | Schink | 118—48 |
| 3,309,221 | 3/1967 | Smith | 117—93.31 X |

FOREIGN PATENTS

| | | |
|---|---|---|
| 1,212,357 | 3/1960 | France. |

MORRIS KAPLAN, *Primary Examiner.*